United States Patent
Castrucci (10) Patent No.: US 6,858,089 B2
(45) Date of Patent: Feb. 22, 2005

(54) APPARATUS AND METHOD FOR SEMICONDUCTOR WAFER CLEANING

(76) Inventor: Paul P. Castrucci, 41 Pheasant Way, South Burlington, VT (US) 05403

(*) Notice: Subject to any disclaimer, the term of this patent is extended or adjusted under 35 U.S.C. 154(b) by 37 days.

(21) Appl. No.: 10/745,106

(22) Filed: Dec. 23, 2003

(65) Prior Publication Data

US 2004/0134515 A1 Jul. 15, 2004

Related U.S. Application Data

(63) Continuation-in-part of application No. 09/429,869, filed on Oct. 29, 1999.

(51) Int. Cl.[7] .................................................. C23G 1/00
(52) U.S. Cl. ........................ 134/2; 134/3; 134/4; 134/8; 134/25.4; 134/26; 134/28; 134/29; 134/30; 134/34; 134/35; 134/36; 134/41; 134/42; 134/902
(58) Field of Search ................................. 134/2, 3, 4, 8, 134/25.4, 26, 28, 29, 30, 34, 35, 36, 41, 42, 902

(56) References Cited

U.S. PATENT DOCUMENTS

| | | | |
|---|---|---|---|
| 5,868,862 A | | 2/1999 | Douglas et al. |
| 6,203,406 B1 | | 3/2001 | Rose et al. |
| 6,277,753 B1 | | 8/2001 | Mullee et al. |
| 6,346,484 B1 | * | 2/2002 | Cotte et al. ............... 438/725 |
| 6,521,466 B1 | * | 2/2003 | Castrucci .................... 438/5 |
| 6,653,233 B2 | * | 11/2003 | Cotte et al. ............... 438/677 |
| 2001/0050096 A1 | | 12/2001 | Constantini |
| 2003/0003746 A1 | * | 1/2003 | Cotte et al. ............... 438/692 |
| 2003/0047533 A1 | * | 3/2003 | Reid et al. ................ 216/24 |
| 2003/0148222 A1 | * | 8/2003 | Bowman et al. ............ 430/312 |
| 2004/0011386 A1 | * | 1/2004 | Seghal ...................... 134/26 |
| 2004/0072706 A1 | * | 4/2004 | Arena-Foster et al. ...... 510/175 |
| 2004/0087457 A1 | * | 5/2004 | Korzenski et al. .......... 510/177 |

OTHER PUBLICATIONS

J.B. Rubin, et.al, "Precision Cleaning of Semiconductor Surfaces using Carbon Dioxide–Based Fluids", Semicon West '99,.

Standard Operating Procedure, MIT Microsystem Technology Lab, http://www–mtl.mit.edu/6152j/sop/hmds.html.

* cited by examiner

Primary Examiner—Sharidan Carrillo
(74) Attorney, Agent, or Firm—AKC Patent, LLC; Aliki K. Collins (57) ABSTRACT

An improved method for removing contaminant particles from a surface of a semiconductor wafer includes forming a sacrificial film on the surface of the wafer and then removing the sacrificial film by supercritical fluid cleaning. The removal of the sacrificial film via the supercritical fluid cleaning process facilitates removing the contaminant particles. The method further includes identifying and characterizing the contaminant particles and creating a record of the contaminant particle data. The composition of the sacrificial film is selected based on the contaminant particles data and the supercritical cleaning recipe is selected based on the composition of the sacrificial film and the contaminant particles data.

19 Claims, 8 Drawing Sheets

APPARATUS AND METHOD FOR SEMICONDUCTOR WAFER CLEANING

CROSS REFERENCE TO RELATED CO-PENDING APPLICATIONS

This application is a continuation in part of U.S. application Ser. No. 09/429,869 filed on Oct. 29, 1999 and entitled LASER MICROCLEANING APPARATUS AND METHODS the contents of which are expressly incorporated herein by reference.

FIELD OF THE INVENTION

The present invention relates to an apparatus and a method for cleaning semiconductor wafers, and more particularly to semiconductor wafer cleaning that integrates a defect detection and characterization system, and a defect removal system using a sacrificial film and supercritical cleaning.

BACKGROUND OF THE INVENTION

Surface cleaning of a semiconductor wafer has a significant bearing on device test yields. As the semiconductor industry pushes for smaller integrated circuit (IC) dimensions, e.g., 0.35 micron, 0.25 micron and 0.1 micron, the defect density level and size of the smallest particle capable of causing a failure in an IC decrease, as well. For example, for IC devices of 0.35 microns or less particles of the order of one third of the device size, i.e., 0.12 micron or less can cause the circuit to malfunction. Moore's Law projects that by 2005 IC devices will have over 700 million transistors per chip. The Semiconductor Industry Association (SIA) Roadmap projects that the 0.115 micron/300 millimeter wafer technology generation in 2005 will require a very low defect level of only 1260 defects per millimeter square for robust test yields.

Table 1 illustrates the effect of defect density level on test yield for several 0.18 micron products. For a 1 Gigabit dynamic RAM (DRAM) memory a decrease in defect density from 0.10 Defects/cm$^2$ to 0.01 Defects/cm$^2$ increases the device process yield from 12% to 81%. Similar yield increases are observed in a 1000 MIP Microprocessor and a System on a Chip (SOC) device. The results of Table 1 are included in an internal report presented to Applied Materials by Dr. Wayne Ellis and Paul Castrucci, entitled "AMAT Scenario 2003-IC Yield Analysis" October 1998, incorporated herein by reference.

The IC industry needs technology tools that will eradicate defects in order to achieve the very low defect levels required to produce products with very fine feature sizes while maintaing commercially viable wafer processes with high test yields.

TABLE 1

| Product | Defect Density (Defects/cm$^2$) | Test Yield (%) |
| --- | --- | --- |
| 1 Gigabit DRAM | 0.01 | 81 |
| 1 Gigabit DRAM | 0.03 | 53 |
| 1 Gigabit DRAM | 0.1 | 12 |
| Microprocessor (1000 MIP) | 0.01 | 70 |
| Microprocessor (1000 MIP) | 0.03 | 28 |
| Microprocessor (1000 MIP) | 0.1 | 12 |
| System on a Chip (SOC) | 0.01 | 64 |
| System on a Chip (SOC) | 0.03 | 25 |
| System on a Chip (SOC) | 0.1 | 12 |

Surface defects of an IC include surface structural disorders and discrete pieces of matter that range in size from submicron dimension to granules visible to observation with the eye. Surface structural disorders include microscratches, metal etching stringers, missing contacts, and bridging due to tungsten residue during chemical mechanical polishing (CMP). Discrete pieces of matter may be fine dust, dirt particles, foreign molecules including carbon, hydrogen, and/or oxygen. Particulate contaminants ("particulates") frequently adhere to a surface by weak covalent bonds, electrostatic forces, van der Waals forces, hydrogen bonding, coulombic forces, or dipole-dipole interactions, making removal of the particulates difficult. Particulates frequently encountered in practice include polysilicon slivers, photoresist particles, metal oxide particles, and slurry residue. It is known that not all particulates are equally undesirable. For example, particulates that adhere at some non-sensitive portions of the IC circuitry may have no effect on operation or performance, and need not necessarily be removed ("don't cares"). On the other hand, particulates that adhere to active areas or critical locations ("killer defects") can cause failure of the IC circuitry and must be removed for proper operation.

Semiconductor surface cleaning technology involves breaking the above mentioned adhesion bonds and removal of the contaminants. The known methods of semiconductor surface cleaning include chemical wet-processes, e.g. RCA and Piranha etch, chemical dry-processes, mechanical processes, thermal, ultrasonic, optical techniques and combinations thereof. The chemical wet-processes require large amounts of chemical solutions and water. These chemical solutions are expensive, frequently introduce new contaminants, and their disposal causes an environmental problem. Thermal processes require in some cases melting of the top surface and removal via ultra high vacuum pressure. The melting of the top layer may disturb the integrity of the previously deposited layers and the high vacuum equipment are both expensive and time consuming to operate. Thermal annealing does not require melting of the top surface. However, it requires longer exposure to temperatures below the melting point, which may cause undesired diffusion of particles and changes of the crystalline structure.

Gas-phase chemical dry-cleaning processes have been used for years to clean semiconductor surfaces. Among the various chemical dry-cleaning processes, the supercritical fluid cleaning process offers many advantages.

At temperatures above 31° C. and pressure of 1072 psi, the liquid and gaseous phases of $CO_2$ combine to form supercritical $CO_2$ (SCCO2). Supercritical fluid possesses liquid-like solution and gas-like diffusion properties. SCCO2 has low viscosity and low dielectric constant. The low viscosity of SCCO2 enables rapid penetration into crevices, pores, trenches and vias with complete removal of both organic and inorganic contaminants. Organic contaminants that can be removed with SCCO2 include oils, grease, organic films, photoresist, plasticizers, monomers, lubricants, adhesives, fluorinated oils and surfactants. Inorganic contaminants that can be removed with SCCO2 include metals, metal complexing agents, inorganic particulates. Contaminants solvate within the SCCO2 and are evacuated into a low pressure chamber, where they become insoluble and are precipitated from the liquid $CO_2$. The supercritical fluid technology cleaning tool SCF-CT apparatus has a small footprint of about 75 square feet and sells for about $500K to $1M. Conventional water clean benches cost over $2M. The process of cleaning semiconductor surfaces using SCCO2 is described in a technical paper entitled "Precision Cleaning of Semiconductor Surfaces Using Carbon Dioxide Based Fluids" by J. B. Rubin, L. D.

Sivils, and A. A. Busnaina published in Proceedings SEMI-CON WEST 99, Symposium On Contamination Free Manufacturing for Semiconductor Processing, San Francisco, Calif. Jul. 12–14, 1999, the entire content of which is expressly incorporate herein by reference.

While cleaning of semiconductor surfaces with SCCO2 has proven to be effective for removing particles, improved cleaning results are required before this process can become commercially successful. In particular, an improved process of utilizing supercritical cleaning and an intelligent cleaning system that incorporates defect diagnostics, and optimal cleaning based on this improved process is desirable.

SUMMARY OF THE INVENTION

In general, in one aspect, the invention features a method of cleaning a semiconductor wafer including providing a semiconductor wafer comprising patterns for electronic circuitry and contaminant particles on a surface of the wafer and forming a solid sacrificial film on the surface of the wafer. Next, performing supercritical fluid cleaning of the semiconductor wafer to physically remove the sacrificial film from the wafer surface, whereby removing of the sacrificial film facilitates removing the contaminant particles from the surface. The supercritical fluid cleaning comprises applying a supercritical fluid cleaning recipe effective for removing the sacrificial film.

Implementations of this aspect of the invention may include one or more of the following features. The sacrificial film may comprise collodion, pyroxylin, nitrocellulose, hexamethyldisilazane (HMDS). The solid sacrificial film may be formed by spraying or spinning a solution onto the wafer surface and then drying a solvent in the solution to form the solid sacrificial film. The solid sacrificial film may also be formed by chemical vapor deposition, sputtering, thermal evaporation, or molecular beam epitaxy. The supercritical fluid cleaning recipe is a generic recipe and includes placing the wafer in a pressure chamber, introducing a gas that undergoes a supercritical transition into the pressure chamber, setting temperature and pressure in the pressure chamber to produce a supercritical fluid on the surface of the wafer, and exposing the wafer for a predetermined time to the supercritical fluid. In one example, the supercritical fluid is carbon dioxide and the temperature and pressure range from 20 to 70° C. and 1050 to 10000 psi, respectively. The supercritical fluid may be carbon dioxide, carbon monoxide, argon, nitrogen, helium, xenon, nitrous oxide, ethane, or propane. The supercritical fluid cleaning recipe may be a sacrificial film specific recipe including placing the wafer in a pressure chamber, introducing a gas that undergoes a supercritical transition into the pressure chamber, setting temperature and pressure in the pressure chamber to produce a supercritical fluid on the surface of the wafer, introducing a sacrificial film specific-co-solvent into the pressure chamber creating a mixture of supercritical fluid with the sacrificial film specific co-solvent, and exposing the wafer for a predetermined time to the mixture. The sacrificial film specific co-solvent may be methanol, isopropyl alcohol or other related alcohols, butylene carbonate, propylene carbonate or related carbonates, ethylene glycol or related glycols, ozone, hydrogen fluoride or related fluorides, ammonium hydroxide or related hydroxides, citric acid or related acids or mixtures thereof. The volume ratio of the sacrificial film specific co-solvent to the supercritical fluid is within the range of 0.001 to 15 percent.

In general, in another aspect, the invention features a method for removing contaminant particles from a surface of a semiconductor wafer including transferring the wafer among a plurality of processing stations under computer control in a predetermined sequence starting at an input station and ending at an output station and identifying and characterizing contaminant particles on the wafer surface at at least one of the processing stations and creating a record of the contaminant particles data for the wafer at the at least one processing station. Next, forming a solid film of sacrificial material on the wafer surface wherein a composition of the solid film is selected based on the contaminant particles data. Next, transferring the solid film composition data and the contaminant particles data to a supercritical fluid cleaning station and transferring the wafer to the supercritical fluid cleaning station. Next, performing supercritical fluid cleaning of the semiconductor wafer to physically remove the sacrificial film from the surface, whereby removing the sacrificial film facilitates removing the contaminant particles from the surface and wherein the supercritical fluid cleaning station is adapted to apply a supercritical fluid cleaning recipe based on the solid film composition data and the contaminant particles data. Finally, transferring of cleaned wafers to an output station.

Implementations of this aspect of the invention may include one or more of the following features. The contaminant particles identification and characterization data comprise composition, position coordinates, type, density and size of contaminant particles on each wafer. The process of identifying and characterizing of contaminant particles on the wafer is performed by an advanced patterned wafer inspection system with an automatic contaminant particles classification program. The advanced patterned wafer inspection system with an automatic contaminant particles classification program is a COMPASS™ system with On-The-Fly Automatic Defect Classification (OTF™-ADC). The process of identifying and characterizing of contaminant particles may also be performed by a scanning electron microscope, an optical microscope, and an atomic force microscope. The method may further include-performing an elemental chemical analysis of the contaminant particles and the chemical analysis may be performed by a mass spectrometer, a secondary ion mass spectrometer, a Raman spectrometer, an optical spectrometer, or an Auger spectrometer.

In general, in another aspect, the invention features a semiconductor wafer cleaning apparatus including equipment for forming a solid sacrificial film on a surface of a semiconductor wafer, equipment for performing supercritical fluid cleaning of the semiconductor wafer to physically remove the sacrificial film from the surface, whereby removing the sacrificial film facilitates removing contaminant particles from the surface. The supercritical fluid cleaning comprises applying a supercritical fluid cleaning recipe effective for removing the sacrificial film.

In general, in yet another aspect, the invention features a semiconductor wafer cleaning apparatus including equipment for transferring a plurality of semiconductor wafers among a plurality of processing stations under computer control, equipment for identifying and characterizing surface contaminant particles on each wafer at at least one of the processing stations and for creating a record of the contaminant particle data for each wafer at the at least one processing station, equipment for forming a solid sacrificial film on a surface of each of the wafers, and equipment for performing supercritical fluid cleaning of the wafers. The equipment for supercritical cleaning is adapted to receive the surface contaminant particles data from the record and composition data of the sacrificial film and apply a supercritical fluid cleaning recipe based on the contaminant particles data and the composition of the sacrificial film. The apparatus may also include equipment for transferring of cleaned wafers to an output station.

Implementations of this aspect of the invention may include one or more of the following features. The contaminant particles identification and characterization data may be composition, position coordinates, type, density and size of surface defects on each wafer. The equipment for identifying and characterizing contaminant particles on each wafer is an advanced patterned wafer inspection system with an automatic contaminant particles classification program. In one example, the advanced patterned wafer inspection system with an automatic contaminant particles classification program is a COMPASS™ system with On-The-Fly Automatic Defect Classification (OTF™-ADC). The apparatus may further include equipment for identifying and locating specific stubborn contaminant particles with respect to their position coordinates and for updating the data records for any surface cleaned wafer. The equipment for locating specific stubborn contaminant particles may be a scanning electron microscope, an optical microscope, and an atomic force microscope. The apparatus may further include equipment for performing an elemental chemical analysis of the contaminant particles. The equipment for performing a chemical analysis may be a mass spectrometer, a secondary ion mass spectrometer, a Raman spectrometer, an optical spectrometer, or an Auger spectrometer.

Among the advantages of this invention may be one or more of the following. The yield enhancement system (YES) of this invention enables the production of wafers with defect levels of 0.01 defects/$cm^2$ or less. This low defect level translates in significant IC test yield increases. Many semiconductor cleaning applications can be handled by the SCF-CT. The YES system has a significantly smaller footprint and costs less than the traditional wet-chemical process stations. The YES system of this invention is compatible with the small device dimensions and test yield requirements necessary to advance the IC fabrication process in the future. At defect densities of 0.12 defects/$cm^2$ and lower water based wafer cleaning becomes ineffective. The YES system of this invention is a technology enabler for achieving defect densities of 0.03 defects/$cm^2$ and lower. Furthermore, the YES system of this invention produces an economic benefit of the order of several billion dollars in wafer production of 1000 wafer starts per day over the period of one year. Referring to Table 1, the YES system of this invention can produce a SOC wafer with 52 potential dies, a defect level of 0.01 defects/$cm^2$ and a corresponding yield of 64%. The 64% test yield of the 52 die-SOC translates into 33 good dies. Assuming a price of $1000.00 per die and a daily production of 1000 good wafers this translates to $33 million dollars per day or $10 billion dollars per year in good SOC dies. Similarly, for the same SOC wafer with 52 dies at a defect level of 0.04 defects/$cm^2$ and a corresponding yield of 12% we get $2 billion per year of good dies. Therefore, the YES system of this invention enables us to capture a revenue potential of $8 billion per year on SOC wafer production.

The details of one or more embodiments of the invention are set forth in the accompanying drawings and description below. Other features, objects and advantages of the invention will be apparent from the following description of the preferred embodiments, the drawings and from the claims.

BRIEF DESCRIPTION OF THE DRAWINGS

Referring to the figures, wherein like numerals represent like parts throughout the several views.

DETAILED DESCRIPTION OF THE INVENTION

Figure 1A:
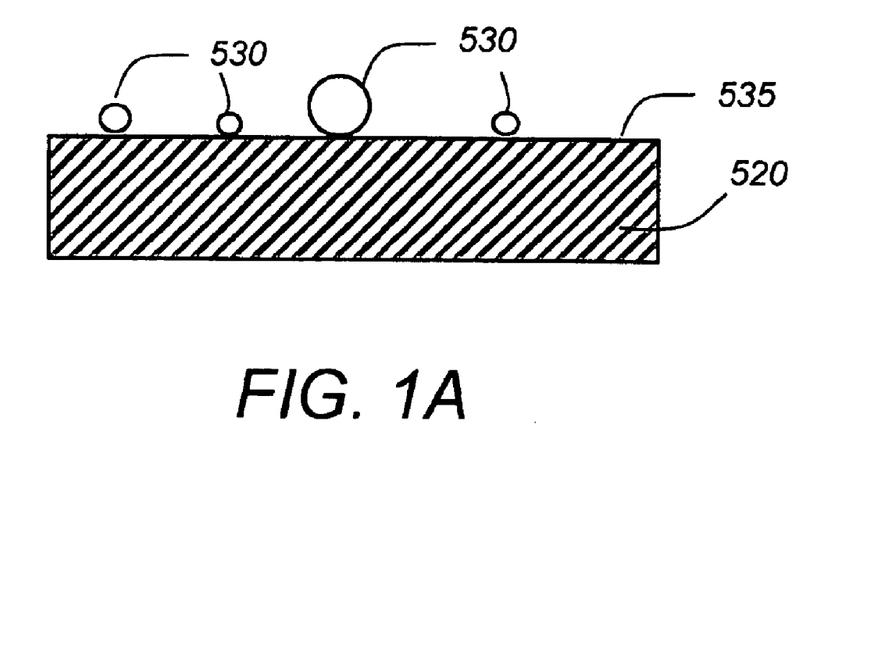
FIGS. 1A-1D are schematic side views illustrating various steps of the improved process of semiconductor wafer cleaning using a sacrificial film and supercritical SCCO2.
Figure 1B:
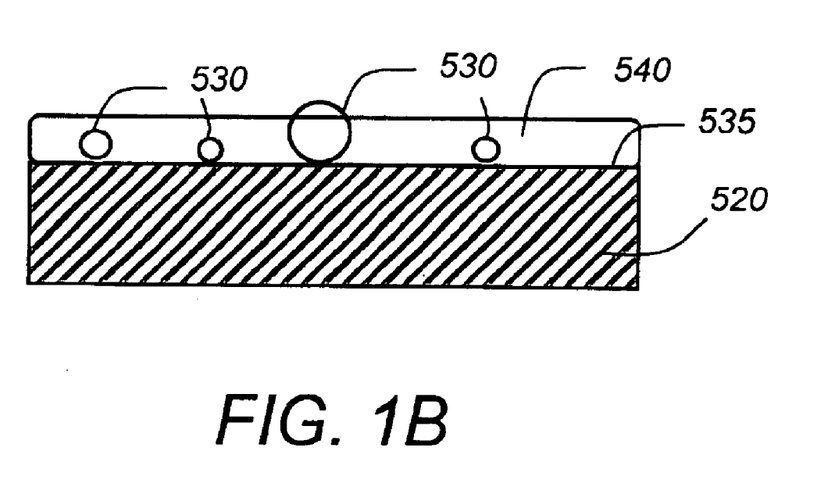
Figure 1C:
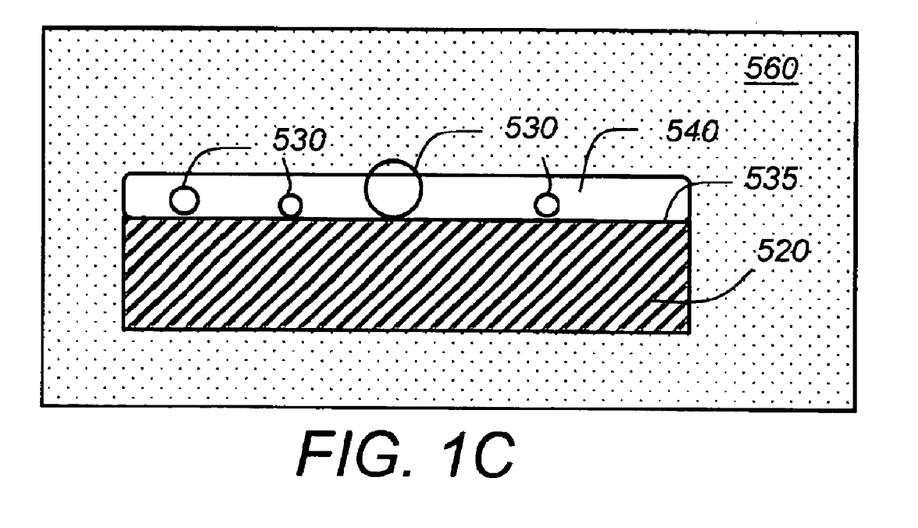
Figure 1D:
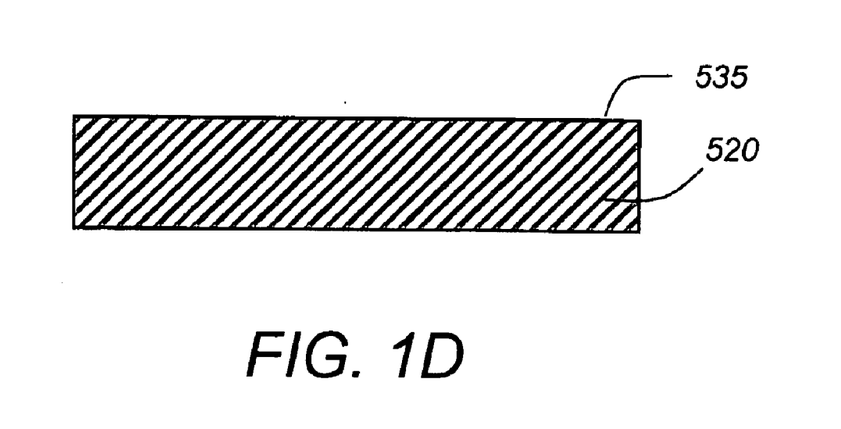

Referring to FIGS. 1A-1D, a substrate 520 (having a surface 535) initially has particulate contaminants 530 of various sizes adherent to surface 535. A sacrificial film 540 is applied to surface 35. The solvent is evaporated, leaving a dry film (FIG. 1B). Substrate 520 with its contaminant particles 530 and sacrificial film 540 is placed in a supercritical. cleaning chamber 560 where at temperatures above 31° C. and pressure of 1072 psi, the liquid and gaseous phases of $CO_2$ combine to form supercritical $CO_2$ (SCCO2). Sacrificial film 540 and the particulate contaminants solvate within the SCCO2 and are evacuated into a low pressure chamber, where they become insoluble and are precipitated from the liquid $CO_2$. The surface 535 is scanned for particles 530 remaining on surface 535 and the locations of stubborn particulate defects, if any, are recorded in a data file. The surface scanning may be performed by utilizing a scanning electron microscope—defect review tool 215 (SEM-DRT described below) or a wafer inspection system 110 (also described below). Finally, the locations in the data file are sent ahead to a subsequent cleaning station, where stubborn particulate defects, if any, are removed individually from those locations. If desired, the locations in the data file may be classified as critical or non-critical, and only the particles at critical locations selectively removed at the subsequent cleaning station. Optionally, criteria other than "criticality" or lack thereof, such as size, shape, color, or composition, may be used to select which particulate defects 530 shall be removed from surface 535.

The sacrificial film 540 is composed of a film-forming material substantially inert to the substrate to be cleaned. In a preferred process, the sacrificial film comprises a film-forming cellulose ester of nitric acid, the most preferred substance being collodion, a solution of soluble nitrocellulose in a mixture of alcohol and ether, the cellulose nitrate having 11.9% to 12.8% nitrogen, corresponding to a range between a trinitrate and a tetranitrate (pyroxylin). The alcohol-ether mixture in which the soluble nitrocellulose is dissolved may be about one part ethanol and about three to seven parts ethoxyethane or alkoxyalkane. The solvent is preferably allowed to evaporate completely, leaving a film of nitrocellulose, before the SCCO2 cleaning step is applied. It should be mentioned in this regard, that so-called "flexible collodion," which frequently contains camphor and castor oil additives, should not be used in this process when cleaning semiconductor wafers, though it may be suitable for use when cleaning some other types of surfaces. For removal of particles having a size distribution ranging from a smallest diameter to a largest diameter, the film of sacrificial material is preferably applied to a thickness between about one-tenth of the smallest particle diameter and about twice the largest particle diameter. Other materials that may be used for sacrificial film include hexamethyldisilazane (HMDS). HMDS is widely used in the semiconductor industry to improve photoresist adhesion to oxides. The HMDS reacts with the oxide surface in a process known as silylation, forming a strong bond to the surface. The methyls bond with the photoresist thereby enhancing the photoresist adhesion. The sacrificial film 540 may be deposited by spinning or spraying a solution on the wafer surface 535 and then drying it to form the solid film 540. Alternatively, sacrificial film 540 may be deposited via chemical vapor deposition, sputtering, thermal evaporation, or molecular beam epitaxy.

Figure 2:
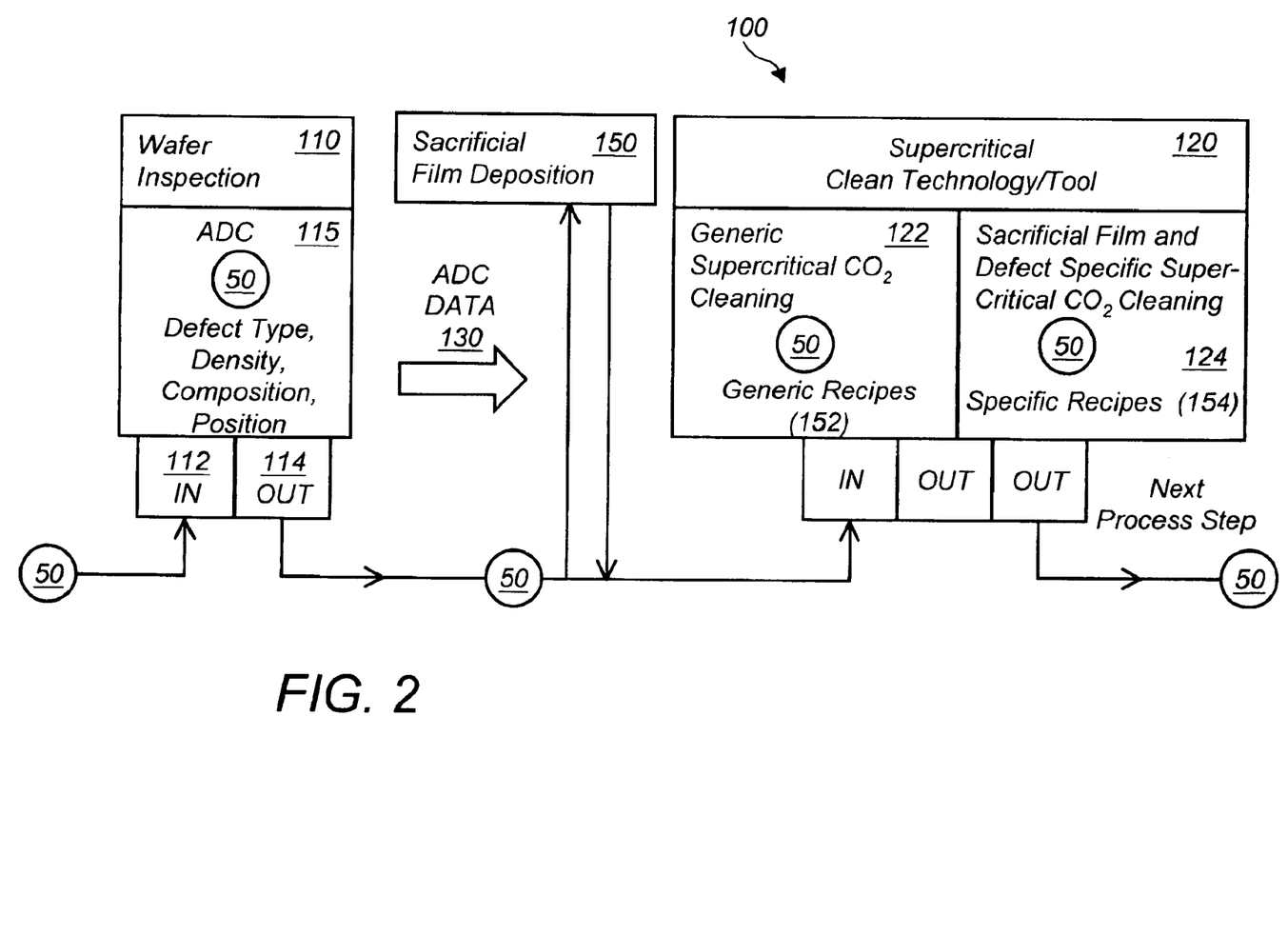
FIG. 2 is a diagrammatic view of a Rapid Yield Enhancement System (RYES) for semiconductor processing using the improved process of FIGS. 1A-1D.

Referring to FIG. 2, a Rapid Yield Enhancement System (RYES) 100 for semiconductor wafer processing includes a wafer inspection system 100 that performs defect detection and characterization system, and a supercritical fluid technology cleaning tool (SCFT-CT) 120. Wafer 50 enters into the wafer inspection system 100 through the IN port 112. The wafer inspection system 100 scans the wafer surface and detects the type, density, size, and position of surface defects. An automatic defect classification program 115 (ADC) groups the defect data in different categories, ADC Data 130. The ADC Data 130 comprising the defect type, density, size, and position data are then transferred to the supercritical fluid technology tool 120. After the inspection wafer 50 exits the inspection system 110 via OUT port 114 and enters the deposition chamber where the sacrificial film 540 is deposited 150. Next the wafer 50 exits the sacrificial film deposition chamber and enters the SCFT-CT 120. The SCF-CT 120 applies first a series of generic recipes 152 for general supercritical fluid cleaning to wafer 50. The general supercritical fluid cleaning is followed by supercritical fluid cleaning utilizing sacrificial-specific and defect-specific recipes 154. Both the generic 152 and specific recipes 154 are chosen based on the information of the ADC defect data 130 provided by the defect characterization system 110 and the chemical composition of the sacrificial film. The RYES 100 is used for on-line electrical test yield improvement of semiconductor wafer manufacturing.

One example of an on-line wafer inspection system 110 for defect detection and characterization is the COMPASS™ Advanced Patterned Wafer Inspection System for Process Monitoring, manufactured by Applied Materials, 350 Bowers Avenue, Santa Clara, Calif. COMPASS™ is an advanced patterned wafer inspection system designed for process monitoring down to the 100 nanometers design rule and below. The COMPASS™ system has the capability of On-The-Fly (OTF™) defect grouping that separates all the detected defects to coarse bins for tighter excursion control and review optimization (data reduction). Furthermore, the COMPASS™ system has high throughput of up to 60 wafers per hour (WPH) and On-The-Fly Automatic Defect Classification (OTF™-ADC). The OTF™-ADC enables efficient process monitoring by providing (a) statistically significant classified defect pareto in real time; (b) real-time data reduction for efficient sampling; (c) smart identification of defects through ADC and comparisons with a set of defect standards (type, topology, chemical composition, e.g. fingerprints).

Figure 3:
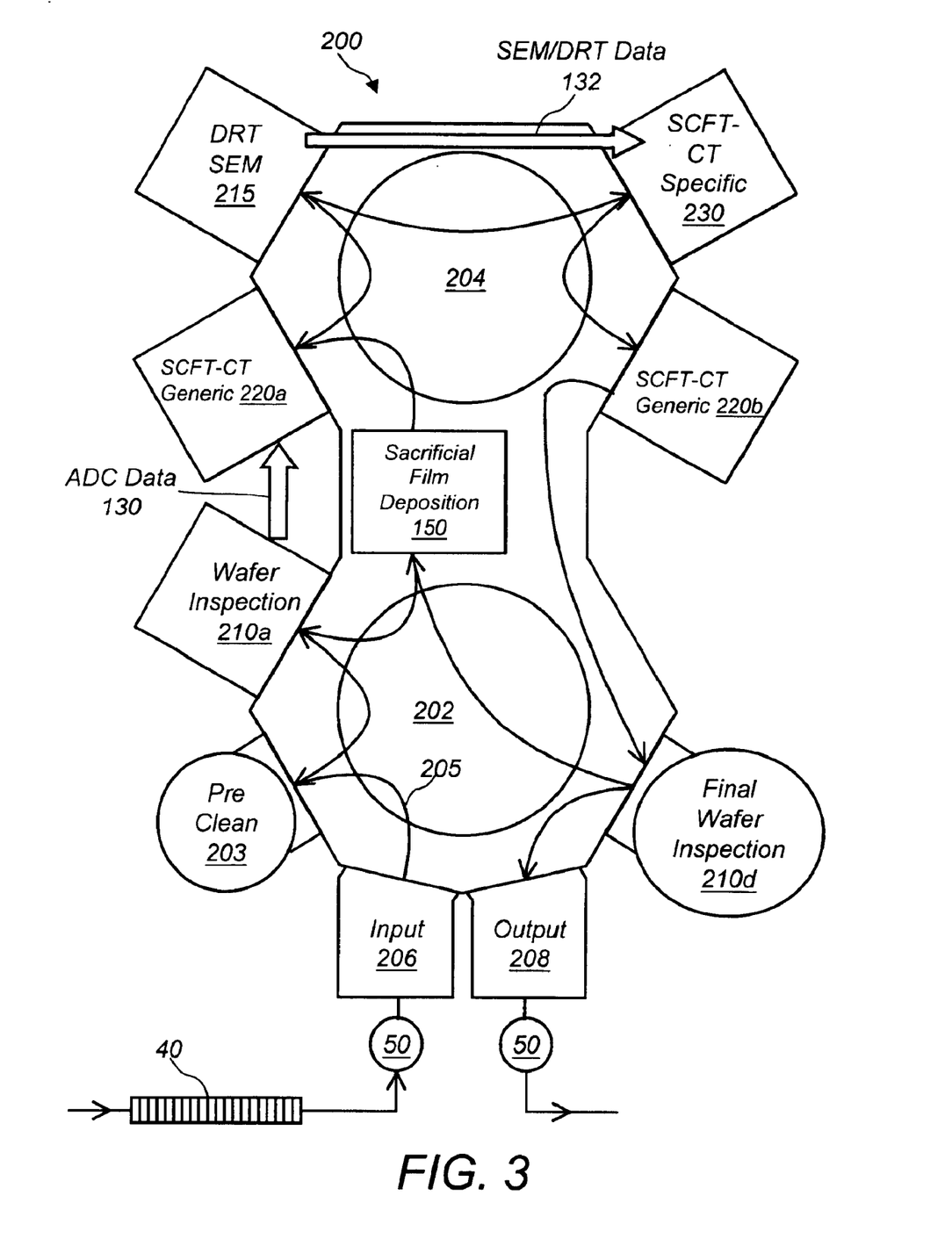
FIG. 3 is a diagrammatic view of an Analytic Yield Enhancement Apparatus (AYES) for semiconductor processing using the improved process of FIGS. 1A-1D.

In the embodiment of FIG. 3 an apparatus for an Analytical Yield Enhancement System (AYES) 200 includes general SCFT-CT 220*a*, 220*b* and sacrificial-specific and defect-specific SCFT-CT 230, Wafer Inspection Stations, 210*a*, 210*b*, Scanning Electron Microscope with a Defect Review Tool (SEM-DRT) 215, a sacrificial film deposition chamber 150, computer controlled cluster tooling 202, 204 for wafer handling and input and output ports 206, 208, respectively. Curved arrows 205 show schematically the movement of wafers from station to station. The SEM-DRT is coupled with automatic defect classification (ADC) software. The AYES 200 is used for laboratory off-line electrical test yield improvement of semiconductor wafer processing.

In one example, general SCF-CT 220 and specific SCF-CT 230 are apparatuses manufactured by GT Equipment Technologies Inc./Supercritical Fluids, Nashua, N.H; wafer inspection stations 210*a*-210*d* are apparatuses manufactured by KLA, 160 San Roblas, San Jose, Calif.; Scanning Electron Microscope-Defect Review Tool (SEM-DRT) 215 is an apparatus manufactured by KLA/Amray, 160 Middlesex Turnpike, Bedford, Mass.; computer software programs 115 that perform automatic defect classification (ADC) are commercially available by Applied Materials, 350 Bowers Avenue, Santa Clara, Calif.; computer controlled cluster tooling for wafer handling purposes including the input and output ports are apparatuses manufactured by Applied Materials, 350 Bowers Avenue, Santa Clara, Calif. Most of the stations in FIGS. 3 and 6 operate with gas atmospheres such as clean air. Furthermore, some of the stations (e.g., wafer pre-clean station and SEM-DRT) require vacuum for their operation, and therefore require conventional airlock interfaces. The sacrificial film deposition chamber may be integrated within the supercritical fluid cleaning apparatus.

Figure 4:
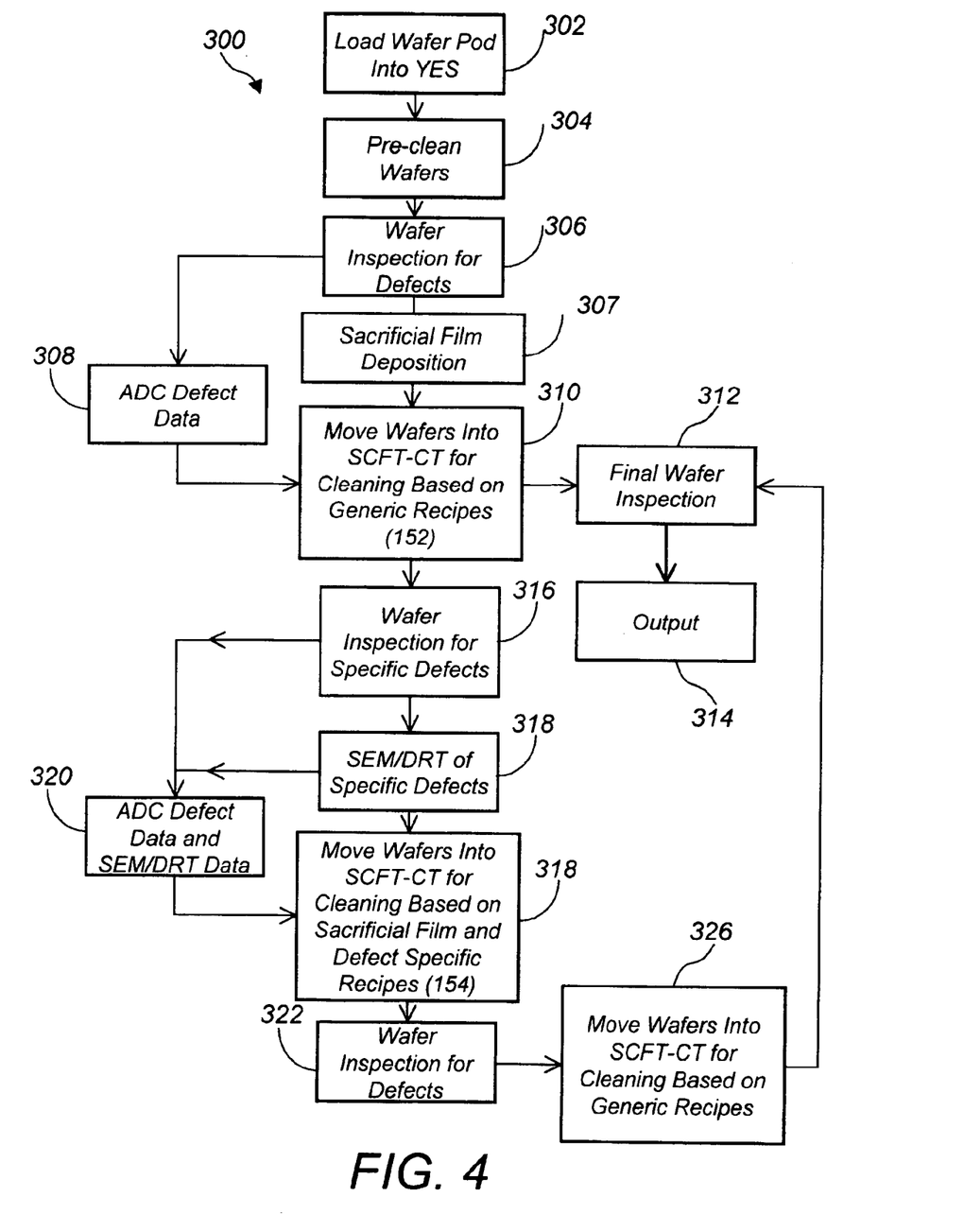
FIG. 4 is a flow diagram of a yield enhancement method for semiconductor processing using the improved process of FIGS. 1A-1D.

Referring to FIGS. 4 and 3, the following steps are performed during a Yield Enhancement process 300. Wafers 50 coming to the AYES apparatus 200 in a pod of wafers 40 (shown in FIG. 3) are loaded at input port 206 (302). Optionally, wafers 50 are processed one by one at a pre-clean station 203 (304). Pre-cleaning is used for removing organic residues or photoresist. Wafers 50 are moved to a wafer inspection station 210*a*. Wafers 50 are scanned for defects and the x-y positional co-ordinates of the defects are determined (306). The defect data from station 210*a* are grouped by an ADC program and the ADC data 130 are transferred to SCFT-CT 220*a* (308). Wafers 50 are then transferred to the sacrificial film deposition chamber where a film of collodion is applied on the previously scanned wafer surfaces. Next wafers 50 are transferred to the SCFT-CT station 220*a* and a general supercritical fluid cleaning takes place utilizing generic recipes (310). The general supercritical fluid cleaning process removes the sacrificial film 540 and contaminant particles 530. Wafers 50 now are subject to optionally being directed to final wafer inspection station 210*b* (312) and output station 208 ("clean wafers") (314); or to scanning electron microscope (SEM) and Defect Review Tool (DRT) Station 215 (318).

The wafers 50 are imaged with the high resolution SEM and the chemical composition of the defects is determined with the DRT. This stage is used to detect and characterize extremely "stubborn defects". The SEM and DRT data 132 are transferred to the SCFT-CT 230 (320). Wafers 50 are then routed to the SCFT-CT 230 (322) where defect specific recipes for supercritical cleaning of the "stubborn defects" are applied (322). The wafers 50 may then get inspected again (324) and the ADC data 130 are transferred to SCFT-CT 220*b*. The wafers 50 are then directed to SCFT-CT 220*b* for another general supercritical fluid cleaning (326). The wafers 50 then go through a final wafer inspection station 210b (312) and outputted at output station 208 (314).

In one example, a generic supercritical fluid cleaning recipe includes placing the wafers in a pressure chamber. The pressure chamber is then sealed and pressurized with the carbon dioxide. As the pressure inside the pressure chamber builds up, the carbon dioxide becomes liquid and reaches supercritical pressure and temperature. Typical conditions for reaching the supercritical phase range from 20 to 70° C. and 1050 to 10000 psi. In addition to chamber pressure and temperature, other process variables of the supercritical fluid cleaning recipe include wafer temperature, soak time, pulsing, i.e., rate of depressurization, flow rate, flow pattern, flow nozzle design, and ratio of liquid to supercritical carbon dioxide mixture. Other gases that may be used for supercritical fluid cleaning include among others argon, nitrogen, nitrous oxide, ethane, and propane.

For sacrificial film specific and defect specific supercritical fluid cleaning a small amount of a specific co-solvent is introduced into the SCCO2 stream. Typical co-solvents that can be added in the SCCO2 stream include methanol, isopropyl alcohol and other related alcohols, butylene carbonate, propylene carbonate and related carbonates, ethylene glycol and related glycols, ozone, hydrogen fluoride and related fluorides, ammonium hydroxide and related hydroxides, citric acid and related acids and mixtures thereof. The amount of the added chemicals range between 0.001 to 15% of volume. In addition to chemistry and the above mentioned parameters, other process variables of the defect specific supercritical fluid cleaning recipe include the concentration of co-solvent and its flow rate. In one example, 3.7 volume percent of butylene carbonate is introduced with a spray nozzle into the SCCO2 stream at a temperature of 85° C., pressure of 2900 psi, and flow rate of 1 liter/minute to remove a fluorinated residue.

Generic and defect specific supercritical cleaning recipes are described in U.S. Pat. No. 6,277,753, U.S. Pat. No. 5,868,862, and U.S. Pat. No. 6,203,406, incorporated herein by reference.

Figure 5:
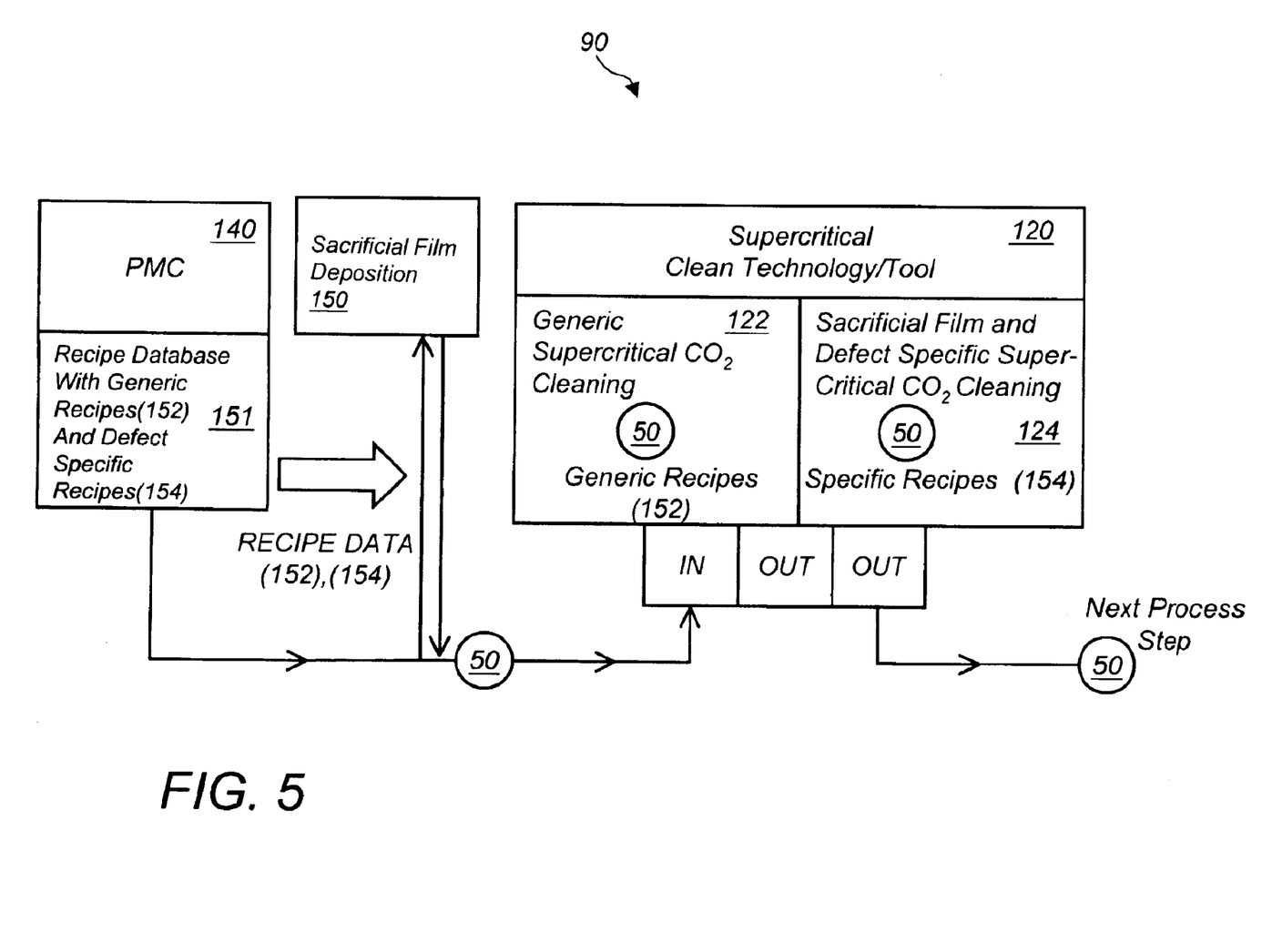
FIG. 5 is a diagrammatic view of an Archival Yield Enhancement System (ARYES) for semiconductor processing using the improved process of FIGS. 1A-1D.

Referring to FIG. 5 another embodiment of the test yield enhancement system, Archival Yield Enhancement System (ARYES) 90 for semiconductor wafer processing includes a recipe database 15, a sacrificial film deposition chamber, and a supercritical fluid technology cleaning tool (SCFT-CT) 120. Database 151 contains data for generic recipe supercritical fluid cleaning 152 and sacrificial film specific and defect specific recipe supercritical fluid cleaning 154 for each process step of the IC fabrication. Both the generic 152 and specific cleaning recipes 154 are based on historical statistical defect data for semiconductor wafer cleaning. After a specific process step, e.g. contact formation, a sacrificial film is deposited on the wafer surface and then wafer 50 enters the SCF-CT 120 cleaning tool. Recipe data for both generic area 152 and specific sacrificial film and defect 154 cleaning appropriate for surface cleaning after the specific process step of the contact formation are transferred to the SCF-CT tool processor. A general supercritical fluid cleaning followed by a specific defect cleaning is applied to wafer 50. The SCF-CT for generic and defect specific supercritical fluid cleaning may be two separate pieces of equipment or the same piece of equipment equipped with a special configuration to accommodate defect specific cleaning.

Figure 6:
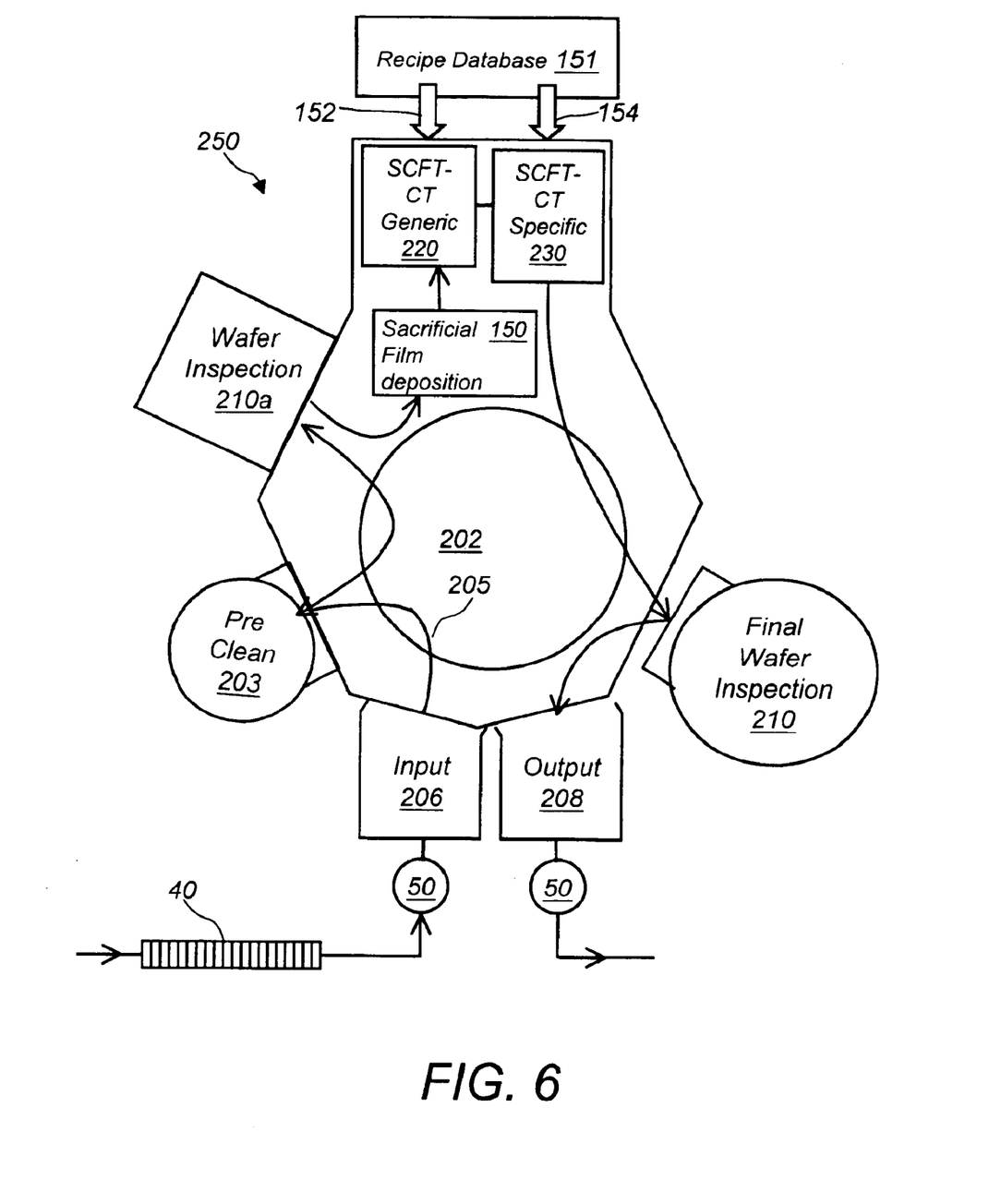
FIG. 6 is a diagrammatic view of another embodiment of a yield enhancement apparatus for semiconductor processing using the improved process of FIGS. 1A-1D.

Referring to FIG. 6 an apparatus 250 according to the above mentioned embodiment of the ARYES system includes generic SCFT-CT 220, defect-specific SCFT-CT 230, a pre-clean chamber 203, a wafer inspection station 210, sacrificial film deposition chamber 150, computer controlled cluster tooling 202 for wafer handling, input and output ports 206, 208, respectively, process module controller 140, and recipe database 151. Curved arrows 205 show schematically the movement of wafers from station to station. Process module controller (PMC) 140 creates process recipes and stores them in database 151. The PMC 140 can create unlimited number of process recipes, with unlimited number of process steps based on input data from statistical process control software.

Figure 7:
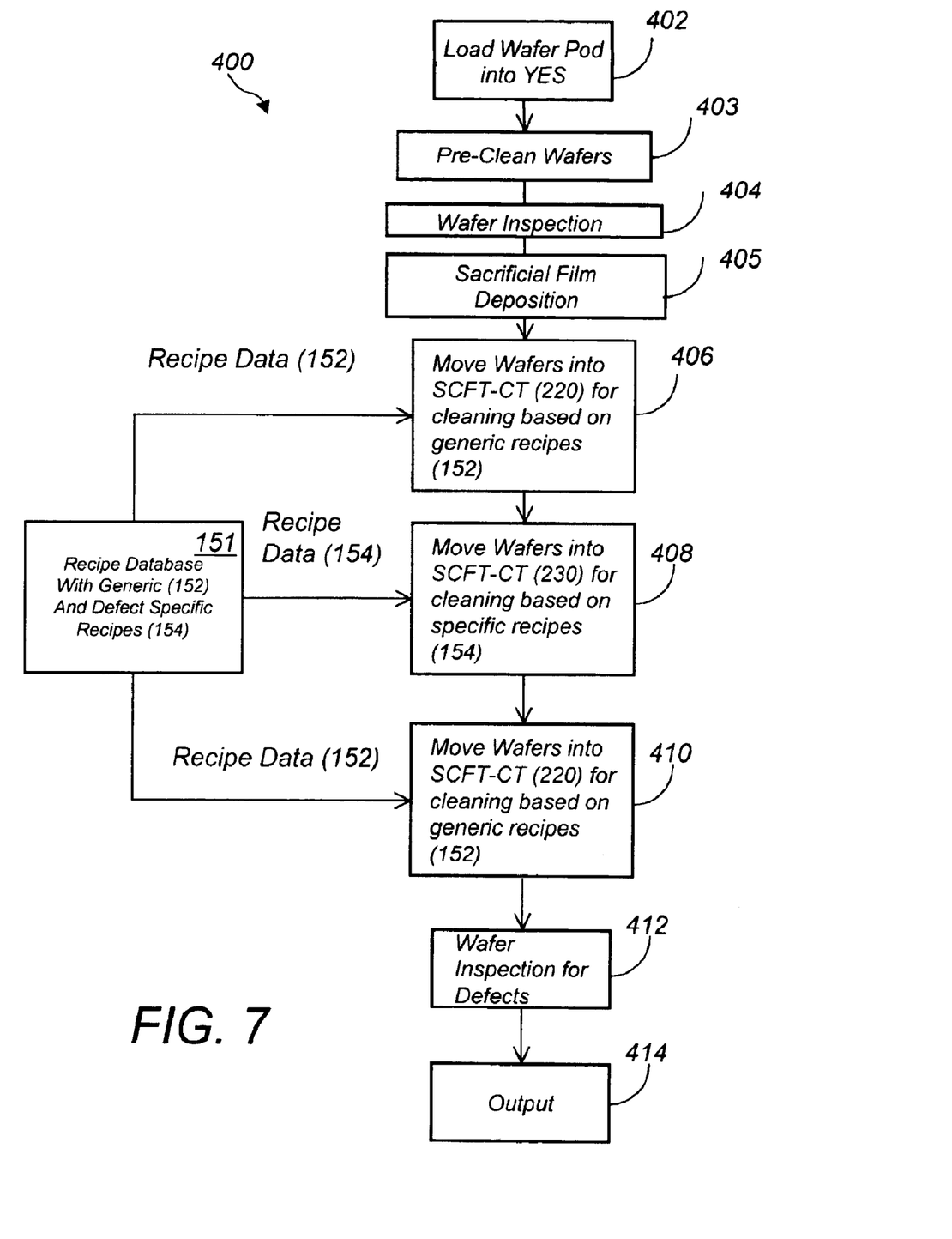
FIG. 7 is a flow diagram of another embodiment of a yield enhancement method for semiconductor processing using the improved process of FIGS. 1A-1D.

Referring to FIGS. 6 and 7, the following steps are performed during this embodiment of a Yield Enhancement process 400. Wafers 50 coming to the ARYES system 250 in a pod of wafers 40 are loaded at input port 206 (402). Optionally, wafers 50 are processed one by one at a pre-clean station 203 (4043. Wafers 50 are then transferred to a Wafer inspection station 210a where defects and contaminants are identified (404). Next, wafers 50 enter a deposition chamber where a sacrificial film is deposited on their surfaces. Next, wafers 50, are transferred to SCFT-CT station 220 and a general supercritical fluid cleaning takes place utilizing generic recipes 152 (406). Recipe database 151 stores and provides the generic recipe data 152 to the SCFT-CT processor. Wafers 50 are then routed to defect specific SCFT-CT 230 (408) where defect specific cleaning takes place utilizing defect specific recipes 154. Recipe database 151 also stores and provides the specific defect recipe data 154 to the SCFT-CT processor. The wafers 50 are then optionally directed through another area cleaning process (410). Finally wafers 50 pass through an inspection station (412) and outputted at output station 208 (414).

Other embodiments are within the scope of the following claims. For example, the defect detection and characterization system for "stubborn defects" 215 may include an optical microscope, a transmission electron microscope, or an atomic force microscope for defect detection. For performing chemical analysis of the "stubborn defects", system 215 may also include a mass spectrometer, a secondary ion mass spectrometer (SIMS), an optical spectrometer, a Raman spectrometer, an atomic absorption spectrometer (AAS), an Auger spectrometer, or an Extended X-Ray Absorption Fine Structure (EXAFS) spectrometer.

Several embodiments of the present invention have been described. Nevertheless, it will be understood that various modifications may be made without departing from the spirit and scope of the invention. Accordingly, other embodiments are within the scope of the following claims.

What is claimed is:

1. A method for removing contaminant particles from a surface of a semiconductor wafer, comprising the steps of:

transferring said wafer among a plurality of processing stations under computer control in a predetermined sequence starting at an input station and ending at an output station;

identifying and characterizing contaminant particles on said wafer surface at at least one of said processing stations and creating a record of said contaminant particles data for said wafer at said at least one processing station;

forming a solid film of sacrificial material on said wafer surface wherein a composition of said solid film is selected based on said contaminant particles data;

transferring said solid film composition data and said contaminant particles data to a supercritical fluid cleaning station;

transferring said wafer to said supercritical fluid cleaning station;

performing supercritical fluid cleaning of said semiconductor wafer to physically remove said sacrificial film from said surface, whereby removing said sacrificial film facilitates removing said contaminant particles from said surface and wherein said supercritical fluid cleaning station applies a supercritical fluid cleaning recipe based on said solid film composition data and said contaminant particles data; and transferring said cleaned wafers to an output station.

2. The method of claim 1 wherein said sacrificial film comprises collodion.

3. The method of claim 1 wherein said sacrificial film comprises hexamethyldisilazane (HMDS).

4. The method of claim 1 wherein said sacrificial film comprises pyroxylin.

5. The method of claim 1 wherein said sacrificial film comprises nitrocellulose.

6. The method of claim 1 wherein said solid sacrificial film is formed by spraying a solution onto said surface and drying a solvent in said solution to form said solid sacrificial film.

7. The method of claim 1 wherein said solid sacrificial film is formed by spinning a solution onto said surface and drying a solvent in said solution to form said solid sacrificial film.

8. The method of claim 1 wherein said solid sacrificial film is formed by a deposition method selected from a group consisting of chemical vapor deposition, sputtering, thermal evaporation, and molecular beam epitaxy.

9. The method of claim 1 wherein said supercritical fluid cleaning recipe is a generic recipe comprising:

placing said wafer in a pressure chamber;

introducing a gas that undergoes a supercritical transition into said pressure chamber;

setting temperature and pressure conditions in said pressure chamber to produce a supercritical fluid on the surface of said wafer; and exposing said wafer for a predetermined time to said supercritical fluid.

10. The method of claim 1 wherein said supercritical fluid cleaning recipe is a sacrificial film specific recipe comprising:

placing said wafer in a pressure chamber;

introducing a gas that undergoes a supercritical transition into said pressure chamber;

setting temperature and pressure conditions in said pressure chamber to produce a supercritical fluid on the surface of said wafer;

introducing a sacrificial film specific co-solvent into said pressure chamber creating a mixture of supercritical fluid with said sacrificial film specific co-solvent; and exposing said wafer for a predetermined time to said mixture.

11. The method of claim 1 wherein said contaminant particles identification and characterization data comprise composition, position coordinates, type, density and size of contaminant particles on each wafer.

12. The method of claim 1 wherein said identifying and characterizing of contaminant particles on said wafer is performed by an advanced patterned wafer inspection system with an automatic contaminant particles classification program.

13. The method of claim 1 wherein said identifying and characterizing of contaminant particles is performed by equipment selected from a group consisting of a scanning electron microscope, an optical microscope, and an atomic force microscope.

14. The method of claim 1 further comprising:

performing an elemental chemical analysis of said contaminant particles.

15. The method of claim 9 wherein said supercritical fluid is carbon dioxide and said temperature and pressure condition range from 20 to 70° C. and 1050 to 10000 psi, respectively.

16. The method of claim 9 wherein said supercritical fluid is selected from a group consisting of carbon dioxide, carbon monoxide, argon, nitrogen, helium, xenon, nitrous oxide, ethane, and propane.

17. The method of claim 10 wherein said sacrificial film specific co-solvent is selected from a group consisting of methanol, isopropyl alcohol, butylene carbonate, propylene carbonate, ethylene glycol, ozone, hydrogen fluoride, ammonium hydroxide, citric acid and mixtures thereof.

18. The method of claim 10 wherein a volume ratio of said sacrificial film specific co-solvent to the supercritical fluid is within the range of 0.001 to 15 percent.

19. The method of claim 14 wherein said chemical analysis is performed by equipment selected from a group consisting of a mass spectrometer, a secondary ion mass spectrometer, a Raman spectrometer, an optical spectrometer, and an Auger spectrometer.

* * * * *